United States Patent
Murugesh et al.

(10) Patent No.: US 6,878,214 B2
(45) Date of Patent: Apr. 12, 2005

(54) PROCESS ENDPOINT DETECTION IN PROCESSING CHAMBERS

(75) Inventors: Laxman Murugesh, San Ramon, CA (US); Gary R. Ahr, Modesto, CA (US)

(73) Assignee: Applied Materials, Inc., Santa Clara, CA (US)

( * ) Notice: Subject to any disclaimer, the term of this patent is extended or adjusted under 35 U.S.C. 154(b) by 48 days.

(21) Appl. No.: 10/057,037

(22) Filed: Jan. 24, 2002

(65) Prior Publication Data

US 2003/0136425 A1 Jul. 24, 2003

(51) Int. Cl.⁷ ................................................ B08B 7/04
(52) U.S. Cl. .................... 134/18; 134/22.1; 134/22.18; 438/905
(58) Field of Search ............................. 438/905; 134/18, 134/21, 22.1, 22.18

(56) References Cited

U.S. PATENT DOCUMENTS

| | | |
|---|---|---|
| 4,289,188 A | 9/1981 | Mizutani et al. |
| 4,430,151 A | 2/1984 | Tsukada |
| 4,491,499 A | 1/1985 | Jerde et al. |
| 4,746,218 A | 5/1988 | Lord, III ................... 356/437 |
| 5,308,414 A | 5/1994 | O'Neill et al. |
| 5,320,704 A | 6/1994 | Horioka et al. |
| 5,348,614 A | 9/1994 | Jerbic |
| 5,356,478 A | 10/1994 | Chen et al. |
| 5,552,016 A | 9/1996 | Ghanayem |
| 5,565,114 A | 10/1996 | Saito et al. |
| 5,632,821 A | 5/1997 | Doi |
| 5,812,403 A | 9/1998 | Fong et al. |
| 5,888,337 A | 3/1999 | Saito ........................ 156/345 |
| 5,966,586 A | 10/1999 | Hao ............................. 438/7 |
| 6,104,487 A | 8/2000 | Buck et al. ................. 356/316 |
| 6,207,008 B1 | 3/2001 | Kijima .................... 156/626.1 |
| 6,228,277 B1 | 5/2001 | Kornblit et al. .............. 216/60 |
| 6,238,937 B1 | 5/2001 | Toprac et al. ................. 438/9 |
| 6,241,847 B1 | 6/2001 | Allman et al. ........... 156/636.1 |
| 6,534,007 B1 | 3/2003 | Blonigan et al. |
| 2002/0195423 A1 * | 12/2002 | Patel et al. .................... 216/73 |

FOREIGN PATENT DOCUMENTS

| | | | |
|---|---|---|---|
| WO | WO 99/06610 A1 | 2/1999 | |
| WO | 9916108 | 4/1999 | |
| WO | 0031773 | 6/2000 | ............ H01J/37/32 |

OTHER PUBLICATIONS

Toda, "Thin beam bulk micromachining based on RIE and xenon difluoride silicon etching," IEEE Transducers '97, International Conference on Solid–State Sensors and Actuators, pp. 671–674, Chicago, 1997.

* cited by examiner

Primary Examiner—Alexander Markoff
(74) Attorney, Agent, or Firm—Robert J. Stern

(57) ABSTRACT

Method and apparatus for determining an endpoint of a cleaning process running in a chamber. In particular, one embodiment of the present invention is a method that includes steps of: (a) directing radiation absorbed by a byproduct of the cleaning process into an exhaust line of the chamber; (b) detecting a measure of absorbance of the radiation by the byproduct; and (c) determining the endpoint when the measure of absorbance falls within a predetermined window.

11 Claims, 6 Drawing Sheets

PROCESS ENDPOINT DETECTION IN PROCESSING CHAMBERS

TECHNICAL FIELD OF THE INVENTION

One or more embodiments of the present invention pertain to method and apparatus for process endpoint detection in processing chambers including, without limitation, semiconductor processing chambers. In particular, one or more embodiments of the present invention pertain to method and apparatus for process endpoint detection of cleaning processes in semiconductor processing chambers.

BACKGROUND OF THE INVENTION

As is well known, processing chambers (for example, and without limitation, processing chambers used to deposit semiconductor films and processing chambers used to etch semiconductor films) need to be cleaned periodically to remove residue formed whenever wafers or substrates are processed therein (for example, such processing chambers may be cleaned after one or more wafers are processed). To clean the processing chambers, a cleaning process is run for a period of time ("clean time") that is dictated typically by a requirement that substantially all residue built up in the processing chambers be removed. Such cleaning processes typically include plasma processes.

Detecting an endpoint for a plasma cleaning process may be performed by monitoring radiation output from a plasma formed within the processing chamber. The endpoint is identified by detecting the presence, or absence, of particular chemical compositions within the processing chamber, as evidenced by an analysis of the monitored radiation. However, such plasma cleaning processes have been found to be disadvantageous in certain environments due to physical bombardment of interior components of the processing chamber by constituents of the plasma, such physical bombardment causing deterioration of these interior components.

A high density plasma, chemical vapor deposition ("HDP CVD") processing chamber (such as one manufactured by Applied Materials, Inc. of Santa Clara, Calif., "Applied") can be used in a wide range of applications, for example, and without limitation, to deposit a fluorine-doped silicon glass ("FSG") film, to deposit an undoped silicon glass ("USG") film, to deposit a phosphorus-doped silicon glass ("PSG") film, to deposit a film used for shallow trench isolation ("STI"), and so forth. A periodic cleaning process is carried out after one or more deposition processes used in these applications. To avoid the above-described physical bombardment of interior components of the processing chamber, a typical cleaning process for the Applied HDP CVD processing chamber is a "dark" cleaning process, i.e., a chemical process wherein a plasma is formed remotely, i.e., external to the processing chamber, and wherein the remotely generated plasma is admitted to the processing chamber to perform the cleaning process.

FIG. 1 shows a pictorial representation of an Applied HDP CVD chamber. As shown in FIG. 1, HDP CVD chamber 100 includes heating-cooling plate 110, coil assembly 120, interior chamber walls 130, wafer support 140, throttle & gate valve assembly 150, turbo pump 160, foreline 165, roughing valves 170 and 180, turbo valve 190, remote plasma applicator 200, remote plasma injection tube 210, and remote plasma injection manifold 220. During a typical deposition process, deposition precursor gasses enter chamber 100 through nozzles pictorially shown as 230, 240, and 250, and gaseous deposition residues are exhausted from chamber 100 through throttle & gate valve assembly 150 and turbo pump 160. During such a typical deposition process, roughing valve 170 and turbo valve 190 are closed, and roughing valve 180 is open under the control of a controller (not shown). Further, during the deposition process, residues are formed on interior chamber walls 130. During a typical cleaning process, a plasma is generated in remote plasma applicator 200, the plasma flows through remote plasma injection tube 210, and through remote plasma injection manifold 220 into chamber 100. During such a typical cleaning process, roughing valve 170 and turbo valve 190 are open, and roughing valve 180 is closed under the control of the controller. The constituents of the remotely generated plasma interact with the residues to produce gaseous byproducts that are exhausted from chamber 100 through foreline 165 by a roughing pump (not shown).

As is well known, an optimum clean time for each application is a complex function of a number of variables including, without limitation: thickness of residue on interior surfaces of the processing chamber; temperature of interior components of the processing chamber at the inception of, and during, the cleaning process; deposition/sputter ratios used during a deposition process; and chemical composition of the residue. In accordance with prior art techniques, the above-described dark cleaning process is terminated (clean endpoint) after a predetermined time, i.e., the clean endpoint is determined in accordance with a "by-time" algorithm. However, such by-time algorithms are unreliable because, among other reasons, chamber cool down causes temperature variation that produces deposition process variation. Some prior art solutions for determining a clean endpoint for a dark cleaning process entail utilizing "burn boxes" to strike a plasma in the gaseous deposition byproducts. However, such solutions are problematic because they typically require the use of high voltages, are unreliable, and produce electrical noise problems.

In light of the above, there is a need in the art for method and apparatus for determining a clean endpoint for a dark cleaning process.

SUMMARY OF THE INVENTION

One or more embodiments of the present invention advantageously satisfy the above-identified need in the art, and provide a method and apparatus for determining an endpoint of a cleaning process running in a chamber. In particular, one embodiment of the present invention is a method that comprises steps of: (a) directing radiation absorbed by a byproduct of the cleaning process into an exhaust line of the chamber; (b) detecting a measure of absorbance of the radiation by the byproduct; and (c) determining the endpoint when the measure of absorbance falls within a predetermined window.

DETAILED DESCRIPTION

Figure 1:
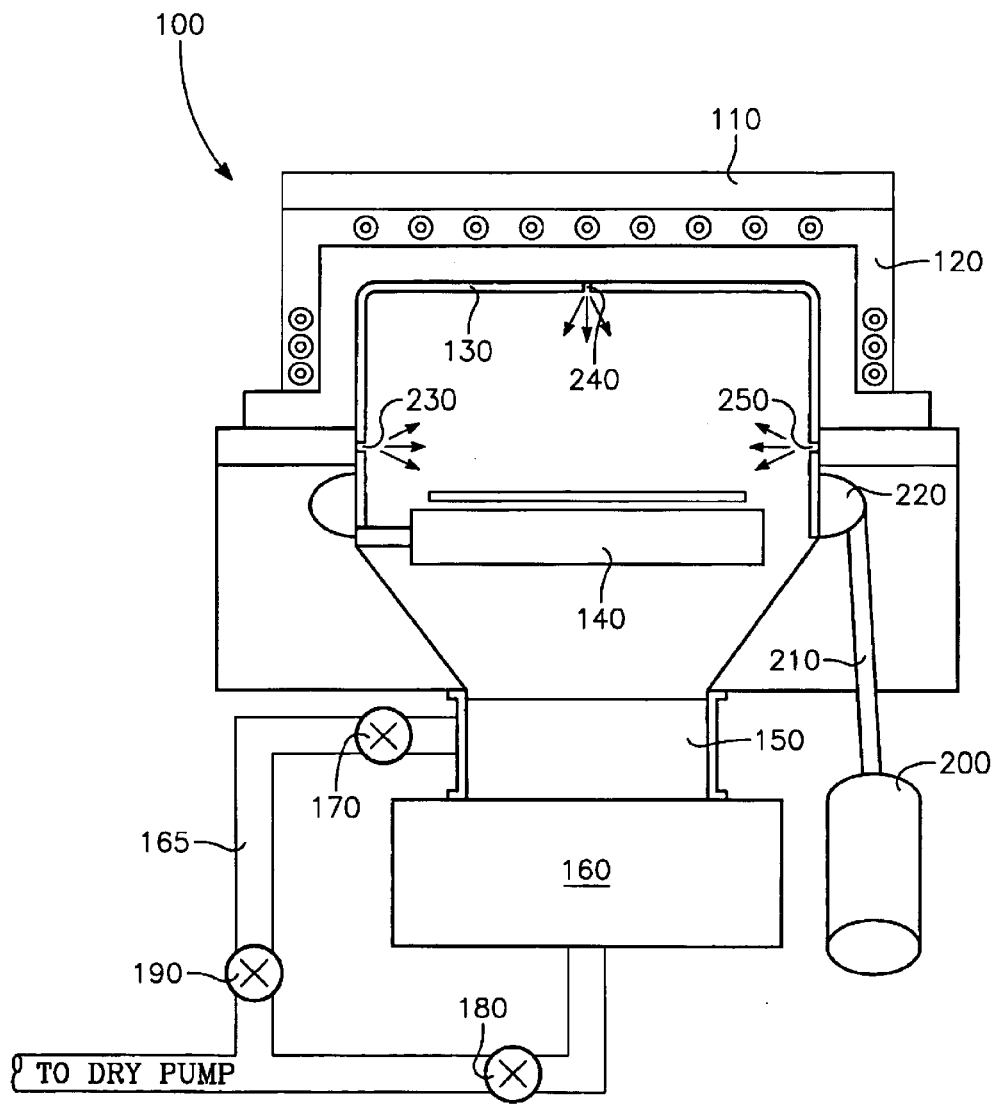
FIG. 1 shows a pictorial representation of an Applied Materials high density plasma, chemical vapor deposition ("HDP CVD") process chamber.
Figure 6:
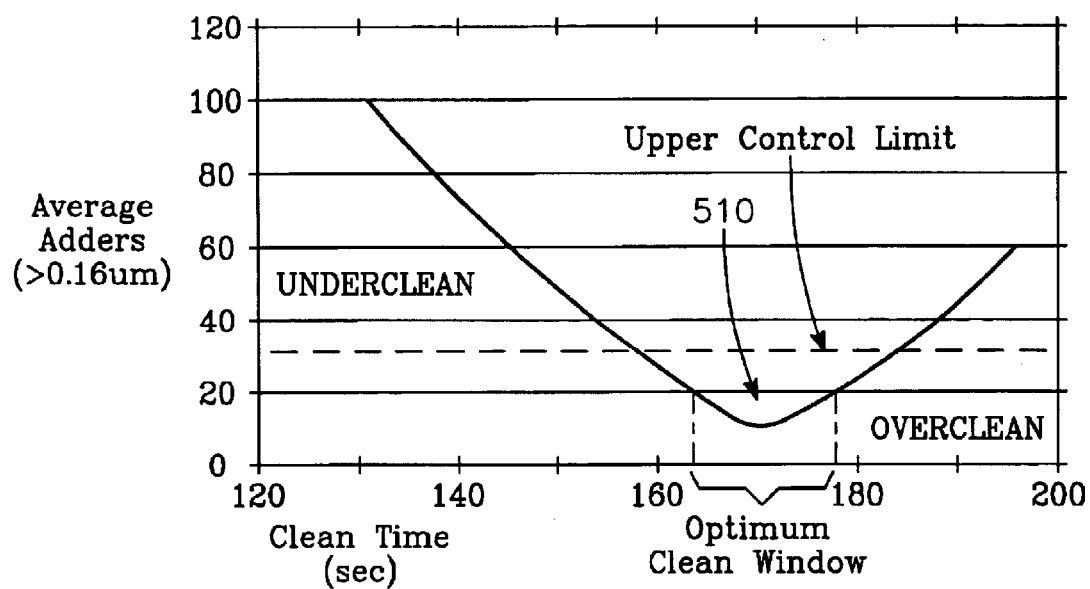
FIG. 6 is a graph that shows particle adders as a function of undercleaning or overcleaning the HDP CVD chamber shown in FIG. 1.

FIG. 6 is a graph that shows particle adders as a function of undercleaning or overcleaning high density plasma, chemical vapor deposition ("HDP CVD") processing chamber 100 shown in FIG. 1 (The term particle adders as used herein refers to particles that are added to a wafer as a result of performing a processing step on the wafer. For example, one might measure the number of particles on the wafer prior to undergoing the processing step, and measure the number of particles on the wafer after undergoing the processing step. The difference in the two numbers is a number of particle adders.). As was described in the "Background of the Invention," a typical cleaning process for an HDP CVD processing chamber manufactured by Applied Materials, Inc. of Santa Clara, Calif. ("Applied") is a "dark" cleaning process, i.e., a chemical process wherein a plasma is formed remotely, i.e., external to chamber 100, and wherein the remotely generated plasma is admitted to chamber 100 to perform the cleaning process. As shown in FIG. 6, the inventors have discovered that poor "particle" performance, i.e., a large number of particle adders, occurs if the cleaning process (i.e., a process to remove residue deposited on interior chamber walls 130 of chamber 100 during a deposition process) ends too soon (an "underclean"), i.e., before 100% of the residue has been removed. The inventors believe that a source or cause of the poor particle performance for an underclean following a deposition process that deposits a silicon glass film to be $SiO_2$ particles. The inventors have also discovered that poor particle performance occurs if the cleaning process ends too late (an "overclean"), i.e., some time after 100% of the residue has been removed. The inventors believe a source or cause of the poor particle performance for an overclean to be aluminum fluoride particles produced by interaction of the cleaning plasma with the surface of interior chamber walls 130. As a result, and as can be seen in FIG. 6, for a particular cleaning process, there is an optimum cleaning window, window 510, during which particles generated as a result of an underclean or an overclean are avoided.

Figure 2:
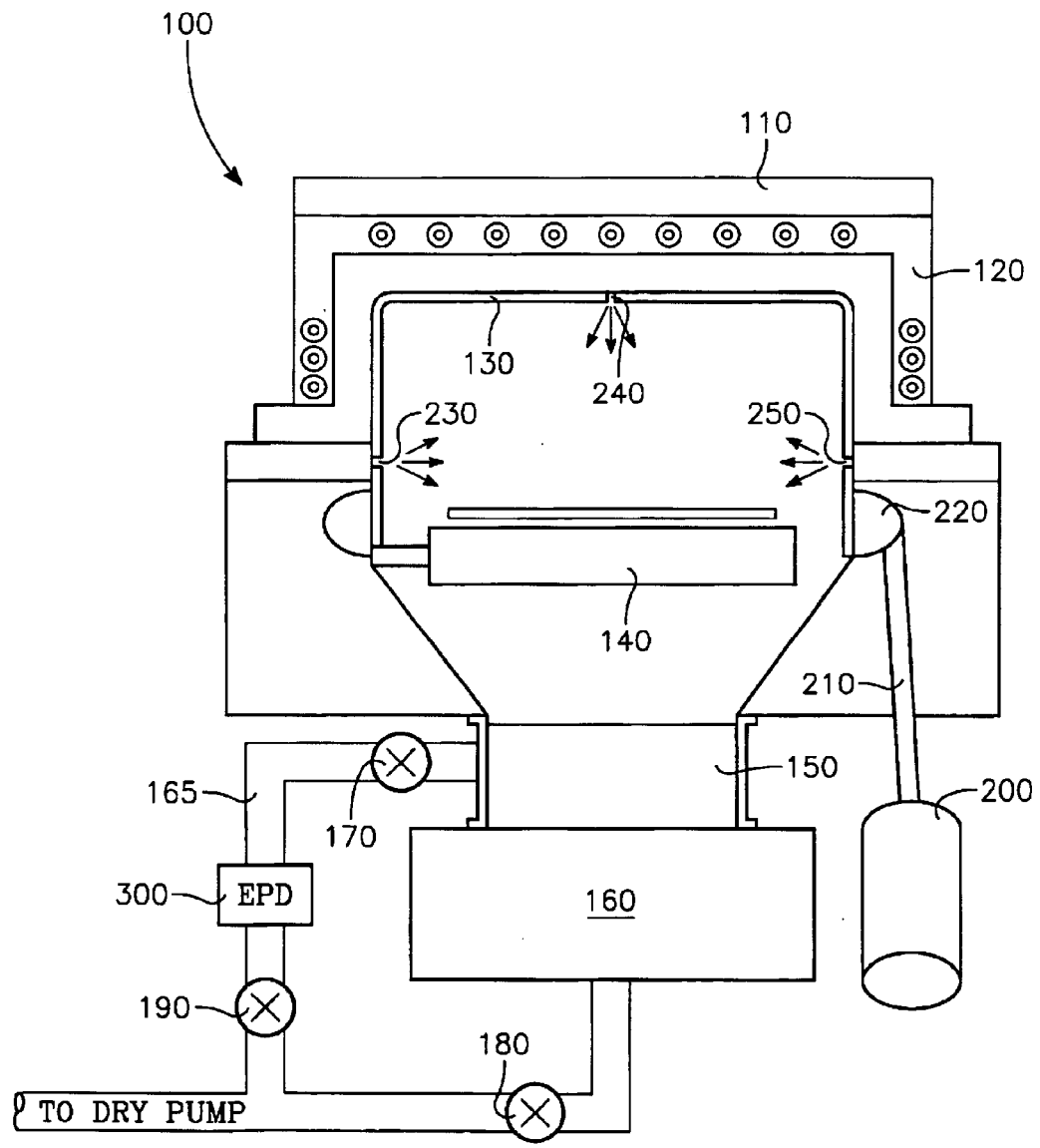
FIG. 2 shows a pictorial representation of the HDP CVD process chamber shown in FIG. 1 which further comprises an endpoint detector that is fabricated in accordance with one embodiment of the present invention.

FIG. 2 shows a pictorial representation of HDP CVD process chamber 100 shown in FIG. 1 which further comprises endpoint detector 300 that is fabricated in accordance with one embodiment of the present invention. One such embodiment is directed to detect an endpoint for a processing chamber cleaning process wherein $SiF_4$ gas is exhausted from chamber 100 as a byproduct of the cleaning process. Such an embodiment is useful, for example, with a wide range of applications such as, for example, and without limitation, to deposit a fluorine-doped silicon glass ("FSG") film, to deposit a undoped silicon glass ("USG") film, to deposit a phosphorus-doped silicon glass ("PSG") film, to deposit a film used for shallow trench isolation ("STI"), to deposit a silicon nitride ("SiN") film, and so forth.

In accordance with this embodiment, infrared radiation ("IR") spectroscopy is used to track, and to detect a clean endpoint at a predetermined level of the $SiF_4$ gas. As such, this embodiment may be used to determine a clean endpoint for a cleaning process wherein substantially no light is generated for use in a standard optical spectroscopy endpoint technique. For example, this embodiment may be used to determine a clean endpoint for a cleaning process wherein a remote plasma generator generates a plasma that is injected into chamber 100. It is well known to those of ordinary skill in the art how to fabricate such a remote plasma generator. For example, and without limitation, a remote plasma generator may comprise a microwave generator that emits microwaves into a cavity through which a gas passes.

Figure 3:
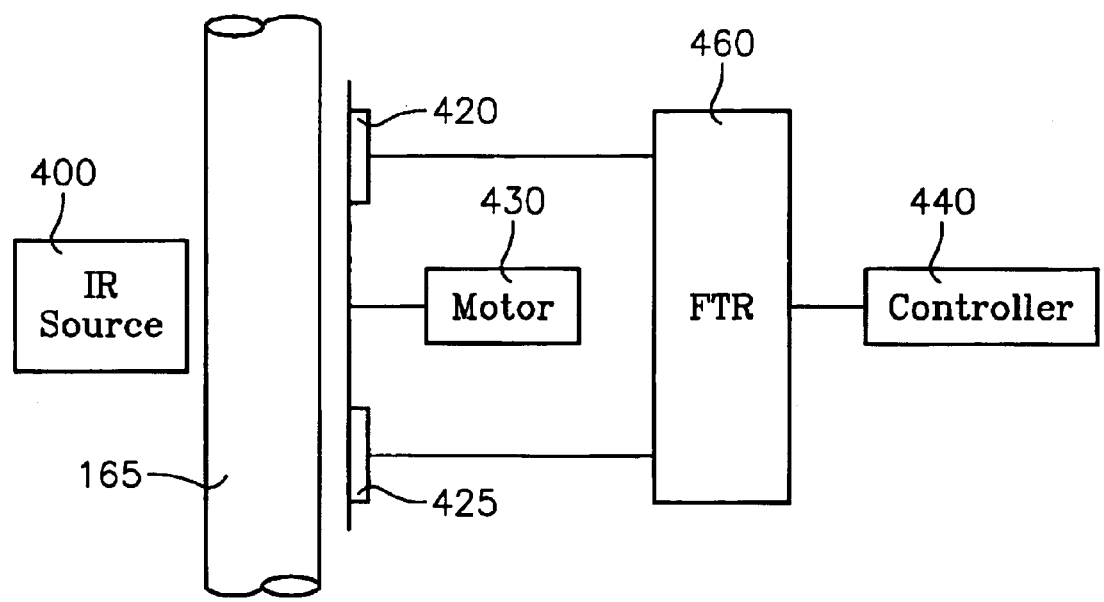
FIG. 3 shows a block diagram of EDP 300 that is fabricated in accordance with one embodiment of the present invention.

As shown in FIG. 2, endpoint detector 300 ("EDP 300") is disposed about foreline 165 of chamber 100. FIG. 3 shows a block diagram of EDP 300 that is fabricated in accordance with one embodiment of the present invention. As shown in FIG. 3, IR source 400 outputs infrared radiation having wavelengths substantially overlapping at least a portion of an absorption band of $SiF_4$ gas (for example, an absorption band of vibrational modes of the $SiF_4$ gas). In accordance with one embodiment, the wavelengths are substantially equal to about 1020 nm. The IR radiation output from IR source 400 is injected through a window (not shown) into a predetermined volume in foreline 165 of a chamber exhaust system of chamber 100 shown in FIG. 2. As further shown in FIG. 3, EDP 300 comprises filters 420 and 425 disposed on chopper wheel 410. Chopper wheel 410 is disposed on an opposite side of foreline 165 from IR source 400 to receive radiation transmitted through another window (not shown) in foreline 165. Filter 420 is constructed to transmit radiation in a band of wavelengths substantially at wavelengths output by $SiF_4$ molecules that have absorbed the infrared radiation output from IR source 400 (for example, filter 420 may transmit radiation in a band of wavelengths centered at about 972 nm), and filter 425 is a neutral density filter that transmits radiation in a band of wavelengths close to the band of wavelength transmitted by filter 420 (for example, filter 425 may transmit radiation in a band of wavelengths centered at about 909 nm). As still further shown in FIG. 3, chopper wheel 410 (and hence filters 420 and 425) is rotated by motor 430 in response to signals from controller 440.

As further shown in FIG. 3, radiation transmitted by filters 420 and 425 is processed by Fourier Transform Raman ("FTR") spectrometer 460 to provide output signals that are applied as input to controller 440 for analysis. For example, an output signal received by controller 440 corresponding to radiation passing through filter 425 is used to determine a background that is subtracted from an output signal received by controller 440 corresponding to radiation passing through filter 420. In accordance with one embodiment of the present invention, a signal output from FTR spectrometer 460 (a "1×signal") is multiplied (for example, by amplifying the 1× signal in accordance with any one of a number of methods that are well known to those of ordinary skill in the art) by a factor of 20 to provide a second signal (a "20× signal"), and the 20× signal is applied as input to controller 440 for analysis. Then, the background-corrected 20× signal is monitored, and an inventive algorithm is used to determine a clean endpoint.

As will be described in detail below, the inventive algorithm is based on removal of $SiF_4$ from chamber 100, and a correlation of the background-corrected 20× signal with particle performance. IR source 400, chopper wheel 410, filter 420, filter 425, FTR spectrometer 460 are fabricated in accordance with any one of a number of methods that are well known to those of ordinary skill in the art, and may be obtained commercially, for example, from MKS Instruments, Inc. of East Hartford, Conn. Controller 440 may be a personal computer, or it may be a controller computer that runs chamber 100. Those of ordinary skill in the art should understand that a 20× signal is used to provide a convenient signal level (for example, a 20× signal provides an appropriate voltage resolution), however, embodiments of the present invention are not limited to use of a 20× signal. In fact, other embodiments exist where a 1× signal is monitored, or any other signal level is monitored. In addition, although an embodiment has been described wherein a chopper wheel was utilized to perform background correction, further embodiments of the present invention are not limited thereby. In fact other embodiments exist wherein background correction may be performed using beamsplitters in a manner which is well known to those of ordinary skill in the art.

Figure 4:
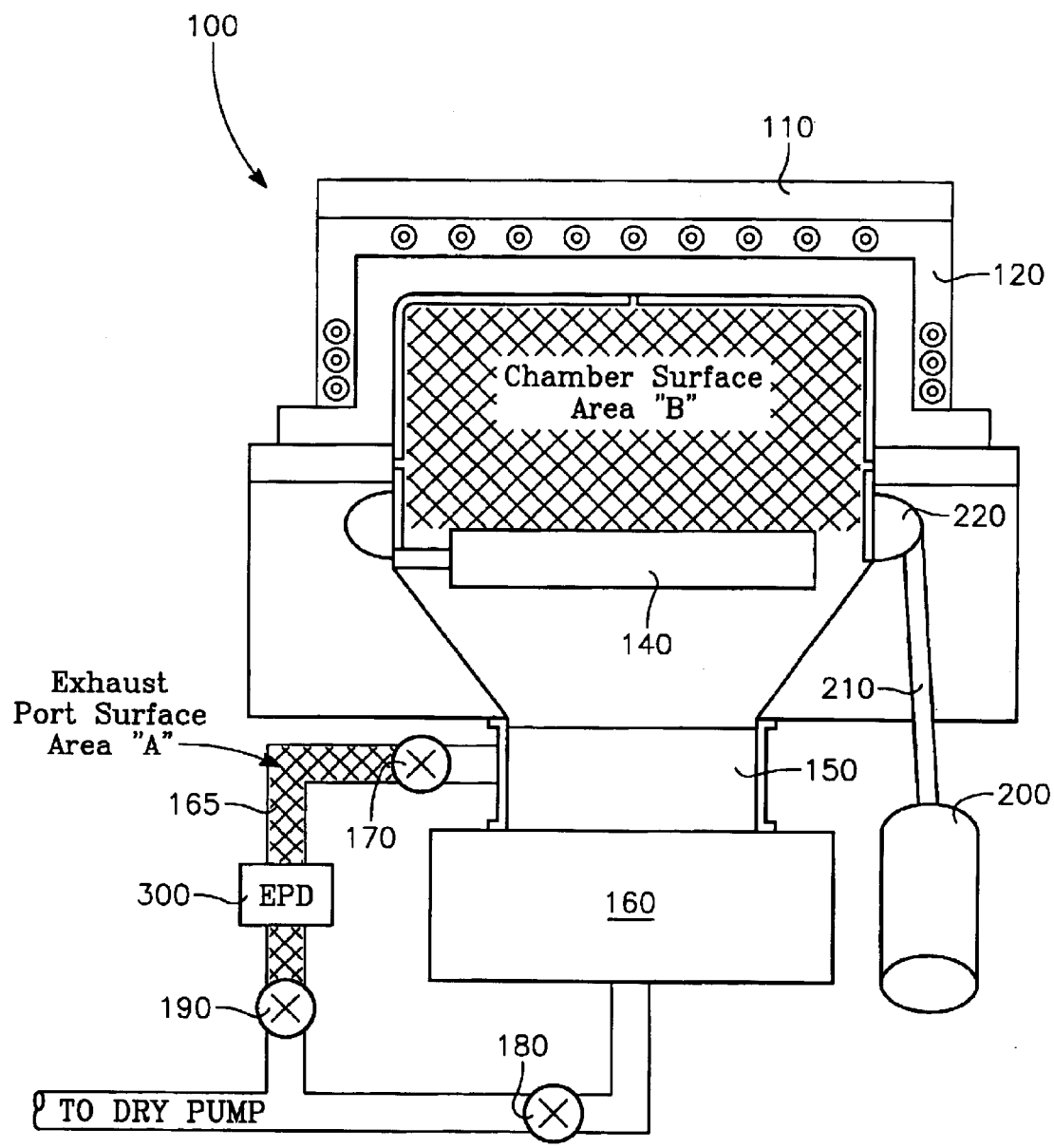
FIG. 4 shows a pictorial representation of the HDP CVD process chamber shown in FIG. 2 wherein an interior surface of the chamber and an interior surface of a cleaning process exhaust port are indicated.

As those of ordinary skill in the art will readily appreciate, the 1× signal, and hence the 20× signal, provides a measure of $SiF_4$ gas IR absorbance in foreline 165 during the cleaning process. In accordance with one embodiment of the present invention, an inventive algorithm detects a clean endpoint whenever the 20× output signal reaches a predetermined voltage level. In accordance with this embodiment, the predetermined voltage level corresponds to a predetermined percentage of $SiF_4$ removal from chamber 100 and an exhaust port of foreline 165. FIG. 4 shows a pictorial representation of HDP CVD process chamber 100 wherein an interior surface of chamber 100 (Chamber Surface Area "B") and an interior surface of the exhaust port (Exhaust Port Surface Area "A") are indicated. In accordance with the inventive algorithm, the percentage $SiF_4$ removal is determined by controller 440 as follows:

$$\frac{(\text{Chamber Surface Area ``B''}) * 100}{(\text{Chamber Surface Area ``B''}) + (\text{Exhaust Port Surface Area ``A''})}$$

In accordance with one embodiment of the present invention, chamber 100 is deemed to be 100% clean, and a clean endpoint is found, whenever 97.5% removal of $SiF_4$ that is generated by the cleaning process from the interior surface of chamber 100 and the interior surface of exhaust port is achieved. Advantageously, in accordance with this embodiment, EPD 300 adjusts the clean time dynamically to provide a consistent level of chamber clean by tracking $SiF_4$ removal during the cleaning process. Thus, if Exhaust Port Surface Area A changes, the determination of the percentage $SiF_4$ removed to achieve a 100% chamber clean will also change.

Figure 5:
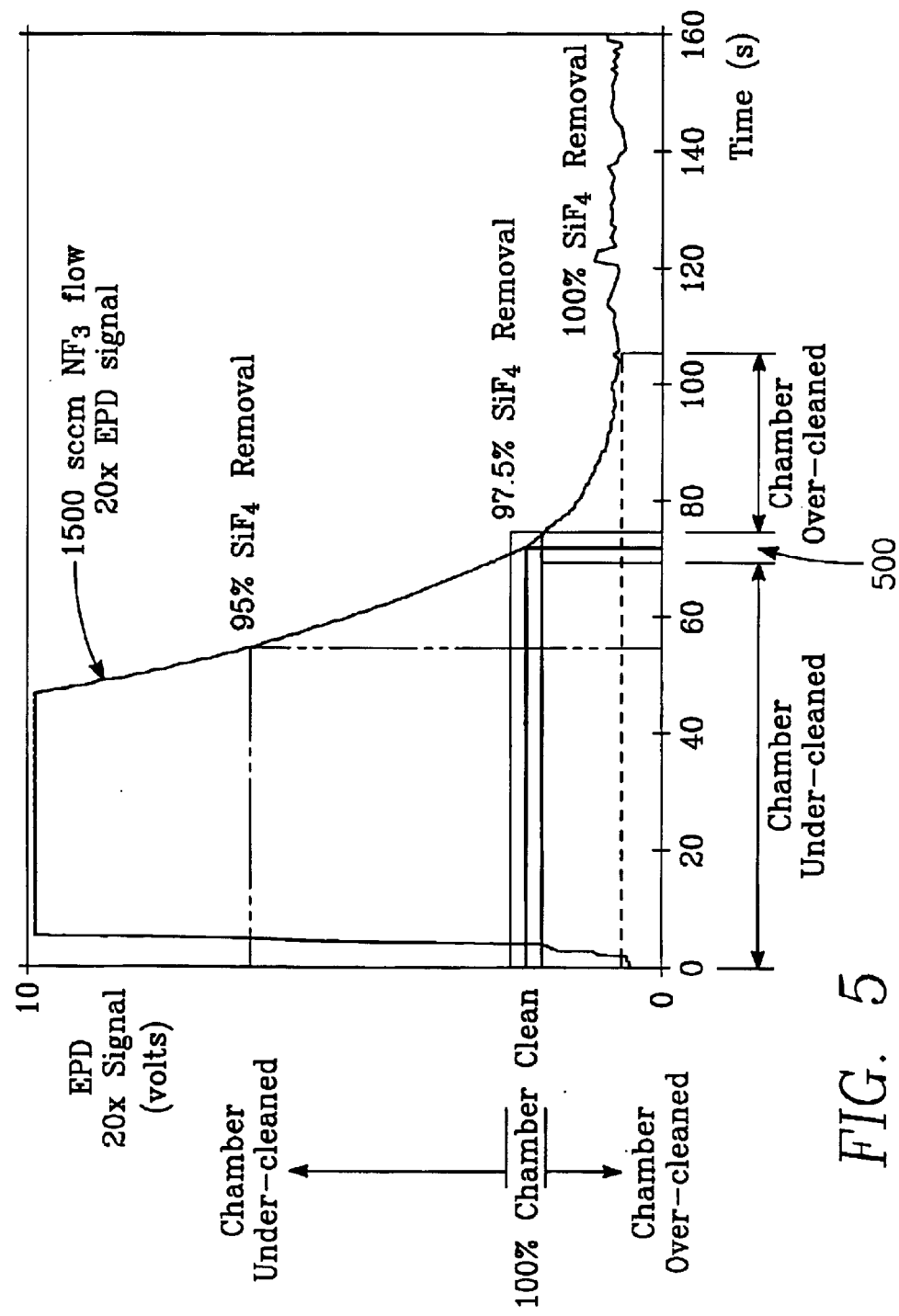
FIG. 5 shows a graphical representation of how a clean endpoint is determined in accordance with one embodiment of the present invention.

FIG. 5 shows a graphical representation of how a clean endpoint is determined in accordance with one embodiment of the present invention As shown in FIG. 5, an amplitude of the 20× signal is plotted on the ordinate as a function of volts and on the abscissa as a function of time (it will be appreciated that a flat-top of the 20× signal is due to saturation for the voltage scale used). As shown in FIG. 5, a voltage amplitude corresponding to 95% $SiF_4$ removal results in an undercleaned chamber; a voltage amplitude corresponding to 97.5% $SiF_4$ removal results in a 100% clean chamber; and a voltage amplitude corresponding to 100% $SiF_4$ removal results in an overcleaned chamber. Thus, as shown in FIG. 5, window 500 corresponds to an optimal clean window that minimizes particle adders resulting from an underclean or an overclean. Advantageously, in accordance with this embodiment of the present invention, the optimal clean endpoint occurs before the time for 100% $SiF_4$ removal from the chamber and the exhaust port.

Further, EDP 300 adjusts the clean time dynamically—under varying process and hardware conditions—by measuring IR absorbance of the $SiF_4$ gas clean byproduct, and by triggering the clean endpoint at the same level each time, independent of chamber conditions, to provide a consistent level of chamber clean. Further, since the optimal clean times are shorter than the times corresponding to 100% $SiF_4$ removal, use of an embodiment of the present invention may provide reduced cleaning gas usage, and higher throughput due to the shorter cleans. Note that, after using this embodiment of the present invention, although there may be some deposits in foreline 165, the chamber is 100% clean. Further note that it is not important completely to clean foreline 165 since foreline 165 is not a source of particles in chamber 100.

In further embodiments of the present invention, the inventive algorithm may be extended to provide an overclean as a percentage of the endpoint time.

As described above, EPD 300 adjusts clean time dynamically within an optimum clean window that is determined as described below, in accordance with one embodiment, by monitoring $SiO_2$ and aluminum fluoride particles to provide a consistent, low-particle, high yield chamber clean. The following describes one embodiment of a method to determine voltage levels that correspond to window 500 shown in FIG. 5 for a predetermined processing step. Step 1: choose a voltage level on a 20× signal to determine an endpoint for a cleaning process (for example, initially, the voltage level should be low enough to correspond to an overclean). Step 2: monitor the cleaning process using EPD 300 and the chosen voltage level to determine the endpoint. Step 3: process a predetermined number of wafers using the predetermined processing step; determine the number of particle adders for each of the wafers in accordance with any one of a number of methods that are well known to those of ordinary skill in the art; and determine an average number of particle adders. Step 4: increase the voltage level used to determine the endpoint for the cleaning process in stages, and repeat step 3 at each stage. The voltage level should be increased eventually to a high enough level to correspond to an underclean. As described above, the average number of particle adders determined at each stage should decrease to a minimum, and then increase as one goes from an overclean condition to an underclean condition. Finally, the voltage levels that correspond to window 500 substantially surround (to within a predetermined amount) the minimum in the average number of particle adders. As those of ordinary skill in the art can readily appreciate, instead of starting at an overclean and moving to an underclean, the above-described process can take place by starting at an underclean and moving to an overclean.

Those skilled in the art will recognize that the foregoing description has been presented for the sake of illustration and description only. As such, it is not intended to be exhaustive or to limit the invention to the precise form disclosed. For example, embodiments may be fabricated which utilize any method for determining the absorbance of one or more gaseous byproducts of a cleaning process. In addition, embodiments may be also used with any cleaning process (for example, and without limitation, plasma cleaning processes (dark or not dark), and non-plasma cleaning processes), and with any kind of processing chamber (for example, and without limitation, deposition chambers and etching chambers).

What is claimed is:

1. A method for determining an endpoint of a cleaning process running in a chamber that comprises steps of:

directing radiation having wavelengths overlapping an absorption band of a byproduct of the cleaning process into an exhaust line of the chamber;

receiving radiation from the exhaust line;

filtering the radiation received from the exhaust line through a first filter that transmits radiation at said absorption band of said byproduct;

filtering the radiation received from the exhaust line through a second filter that transmits radiation in a band of wavelengths different from said absorption band of said byproduct;

determining a measure of absorbance of the radiation by the byproduct by subtracting the radiation filtered through the second filter from the radiation filtered through the first filter;

amplifying said measure of absorbance to provide a voltage signal; and determining the endpoint when the voltage signal reaches a predetermined voltage level.

2. The method of claim 1 wherein the cleaning process is a dark cleaning process and the step of directing comprises directing infrared radiation.

3. The method of claim 1 wherein the step of determining a measure of absorbance further comprises detecting radiation emitted by the byproduct after absorbing the radiation directed in the step of directing radiation.

4. The method of claim 1 wherein the step of determining a measure of absorbance further comprises analyzing the radiation respectively transmitted through the first and second filters using Fourier Transform Raman spectrometry.

5. The method of claim 1 wherein the step of determining a measure of absorbance further comprises generating an output signal representative of the measure of absorbance.

6. The method of claim 1 wherein the step of determining the endpoint when the voltage signal reaches the predetermined voltage level comprises determining when the voltage signal falls below a predetermined level.

7. The method of claim 1 wherein the byproduct is $SiF_4$.

8. An apparatus for determining an endpoint of a cleaning process running in a chamber that comprises:

a radiation source that transmits radiation having wavelengths overlapping an absorption band of a byproduct of the cleaning process into an exhaust line of the chamber;

a first filter positioned to receive radiation from the exhaust line, wherein the first filter transmits radiation at said absorption band of said byproduct;

a second filter positioned to receive radiation from the exhaust line, wherein the second filter transmits radiation in a band of wavelengths different from said absorption band of said byproduct;

a detector that outputs a signal representing the radiation transmitted through the first filter minus the radiation transmitted through the second filter;

a controller, connected to receive the signal outputted by the detector, that generates an endpoint signal when the signal outputted by the detector reaches a predetermined voltage level.

9. The apparatus of claim 8 wherein the cleaning process is a dark cleaning process and the radiation source comprises a source of infrared radiation.

10. The apparatus of claim 8 wherein the controller generates the endpoint signal when the output signal falls below a predetermined level.

11. The apparatus of claim 8 wherein the byproduct is $SiF_4$.

* * * * *